United States Patent
Brown et al.

[11] Patent Number: 6,163,090
[45] Date of Patent: Dec. 19, 2000

[54] PROBE POSITION ACTUATOR WITH AN ELONGATED STROKE

[75] Inventors: Robert Edward Brown, Boca Raton; Christian J. Bunker, Boynton Beach, both of Fla.; Jiann-Chang Lo, Cupertino, Calif.

[73] Assignee: International Business Machines Corporation, Armonk, N.Y.

[21] Appl. No.: 09/334,232

[22] Filed: Jun. 16, 1999

[51] Int. Cl.[7] .................................................. H02K 41/00
[52] U.S. Cl. ............................................................ 310/12
[58] Field of Search ........................ 310/12, 90; 335/249, 335/273, 281

[56] References Cited

U.S. PATENT DOCUMENTS

| | | | |
|---|---|---|---|
| 3,003,827 | 10/1961 | Hentschke | 308/6 |
| 4,864,170 | 9/1989 | Eguchi | 310/12 |
| 5,134,670 | 7/1992 | Kamimura | 384/89 |
| 5,153,472 | 10/1992 | Karidis et al. | 310/13 |
| 5,180,955 | 1/1993 | Karidis et al. | 318/568.1 |
| 5,229,669 | 7/1993 | Takei | 310/12 |
| 5,553,946 | 9/1996 | Agari | 384/49 |
| 5,626,276 | 5/1997 | Lo et al. | 228/4.5 |
| 5,635,849 | 6/1997 | Lo et al. | 324/758 |
| 5,763,965 | 6/1998 | Bader | 310/12 |
| 5,775,567 | 7/1998 | Lo et al. | 228/1.1 |

FOREIGN PATENT DOCUMENTS

| | | |
|---|---|---|
| 60-054864 | 3/1984 | Japan . |
| 60-054865 | 3/1984 | Japan . |
| 60-167669 | 8/1985 | Japan . |
| 4-101657 | 4/1992 | Japan . |

*Primary Examiner*—Nestor Ramirez
*Assistant Examiner*—Judson H. Jones
*Attorney, Agent, or Firm*—Ronald V. Davidge; Richard A. Tomlin

[57] ABSTRACT

A linear actuator includes a stationary stator and an external armature moving with a coil moving within a magnetic structure. A linear bearing including a stationary track fastened to the stator and a moving track fastened to the armature extends on each side of the magnetic structure. In each linear bearing, balls rotate between the stationary and moving tracks with movement of the armature. During the process of manufacturing the linear actuator, the moving track of each linear bearing is loosely mounted to the armature, a pre-load force is applied to the moving track using a tool fastened to the armature, and the moving track is clamped in place so that the pre-load force is subsequently maintained.

9 Claims, 5 Drawing Sheets

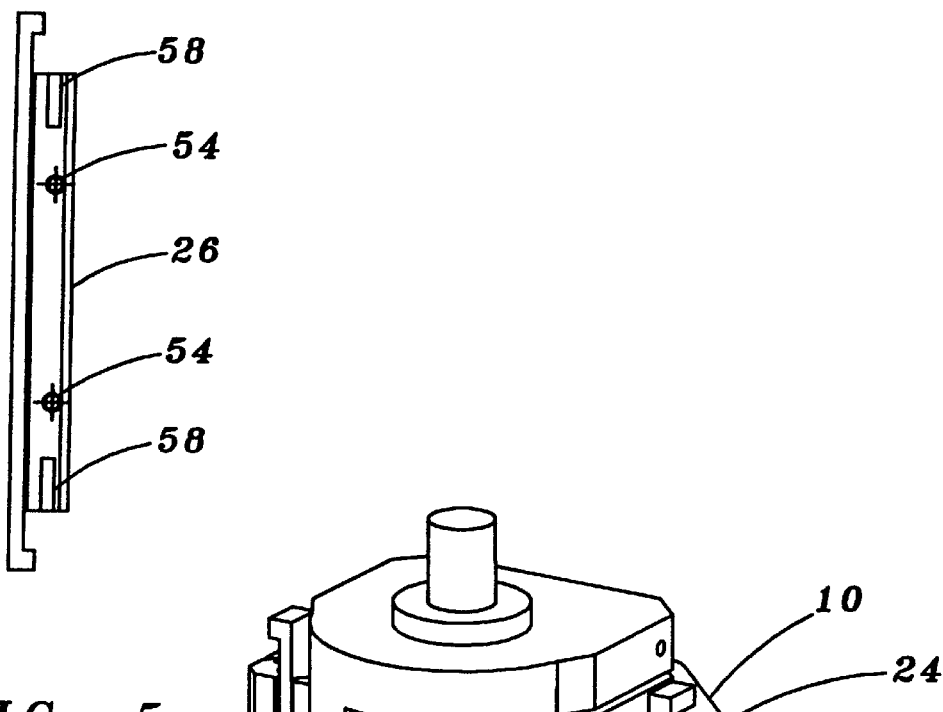
FIG. 5
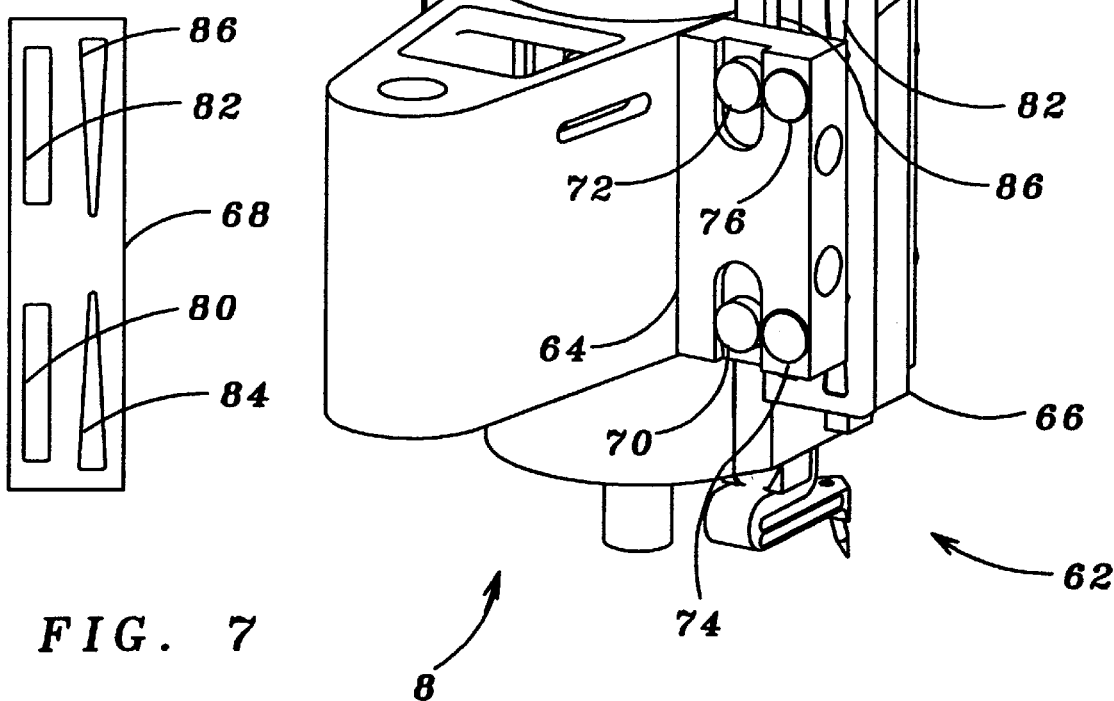
FIG. 7
FIG. 6

PROBE POSITION ACTUATOR WITH AN ELONGATED STROKE

BACKGROUND OF THE INVENTION

1. Field of the Invention

This invention relates to linear motors, or actuators, and, more particularly, to providing such a device with linear bearings extending along each side of an electromagnetic structure and having an adjusted level of pre-load force.

2. Description of the Prior Art

U.S. Pat. No. 5,153,472 describes an actuator for use in positioning a probe. The actuator has a magnet, two C-shaped cores on opposite sides of the magnet, an electromagnetic coil, and an armature movably connected with the cores. The armature has a projecting face located over portions of both pole faces for each core and for the entire range of motion of the armature. The armature is primarily retained with the cores by magnetic attraction by the magnet. The actuator also has an armature position sensor including a light source producing a light beam which is divided to go to two photodetectors. The portions of the divided light beam pass through oppositely oriented triangular apertures moving with the armature, so that, with such movement, the output of one photodetector increases while the output of the other photodetector decreases. The difference between these outputs provides an indication of the position of the armature. A test probe is mounted to the armature, which can be pre-loaded and have dual springs to prevent scrubbing and increase contact force with an object being tested.

U.S. Pat. No. 5,180,99 describes an X-Y positioning apparatus, comprising a multi-bar linkage drive mechanism which may be used to position the actuator of U.S. Pat. No. 5,153,472. The drive mechanism has a base structure and a movable arm structure. The movable arm structure has four arms arranged in a general parallelogram profile with a center of gravity at a main shaft located at a connection of two of the arms. Two of the arms have energizeable electromagnetic coils and the base structure has permanent magnets for moving the arms. Analog and/or digital position sensors can be used. Dynamic balancing can be provided to produce reactionless ultra-high speed X-Y motion. A torque cancellation motor for cancellation of the Z-axis moments produced by these coils can be provided.

Thus, the actuator of U.S. Pat. No. 5,153,472 is used to provide a probing motion in the Z-direction to engage a circuit under test with a probe, with the actuator being mounted on the X-Y positioning mechanism of U.S. Pat. No. 5,180,955. However, this arrangement provides a maximum travel or stroke of only one millimeter. While this arrangement is satisfactory for circuits, such as glass ceramics, which are very flat, what is needed is a Z-direction actuator having a substantially greater stroke, so that printed circuit boards having a warpage of, for example, two millimeters can be tested, and so that the probe may be moved over certain components of populated circuit boards under test.

U.S. Pat. Nos. 5,626,276 and 5,775,567 describe ultrasonic welding apparatus for wirebonding, thus providing an example of another type of application in which a small linear motor having a relatively long stroke can be usefully employed. While the tubular piezoelectric actuator of U.S. Pat. No. 5,775,567 is moved in a vertical direction in and out of engagement with the workpiece by means of a solenoid, U.S. Pat. No. 5,626,276 shows an example of a linear motor being used for this purpose.

Many linear motors in the prior art use linear bearing arrangements including grooved tracks in which balls rotate, with a first pair of such tracks being attached to the moving carriage, and a second pair of such tracks being attached to a stationary framework. Grooves in each such pair of tracks face opposite directions, and a number of bearing balls roll in a space between opposing grooves attached to the moving carriage and to the stationary framework. While, in a way, such a bearing arrangement is similar to a conventional rotary ball bearing, it is much easier to retain close clearances among the grooved bearing races of a rotary ball bearing and the balls retained between the grooves, since such clearances are dependent on the diameters of the grooves and of the bearing balls, with such diameters being easily maintained by modern manufacturing processes. On the other hand, the bearings used in linear motors generally include at least one pair of bearing tracks which are formed as separate pieces, so that it is relatively difficult to control the spacing between the grooves. Thus, what is needed is a method to adjust the spacing between two of the tracks, so that such spacings can be minimized.

A Japanese application, Publication No. of 60-167669, describes a linear motor having a pair of sliders with outwardly-disposed grooves, attached to a sliding carriage, moving within a guiding channel with inwardly-disposed grooves. On each side of the sliders, a number of bearing balls roll between opposing grooves in a slider and in the guiding channel, moving within a plate-shaped retaining cage with holes for the balls. The sliders are held apart, so that the clearance between the grooves and the balls rolling therein is minimized, by means of a wedge-shaped member clamped in place between the sliders by a mounting screw engaging the sliding carriage.

While this ability to minimize clearances provides the linear motor of Japanese application, Publication No. of 60-167669, with an important advantage over other prior art linear motors, the placement of the wedge-shaped member between the sliders requires the placement of the magnetic structure and the coil away from the sliders, so that a torque is developed along with the force causing acceleration when the carriage is moved. This torque results in reaction forces acting on the balls and grooves in the linear bearing arrangements.

U.S. Pat. Nos. 4,864,170 and 5,229,669 describe linear motors having bearings in which grooved channels including bearing balls are aligned with the magnetic structure and coils extending between and/or around the grooved channels, so that the torque developed during acceleration by means of magnetic forces is minimized. However, these linear motors do not have a provision for adjusting the distance between a pair of grooved tracks to minimize clearances around the bearing balls.

U.S. Pat. No. 5,763,965 illustrates another method for eliminating clearances around bearing balls in a linear bearing. On one side of the motor windings and the magnetic structure, bearing balls operate in a pair of opposing grooves in tracks, while on the other side, bearing balls operate between an upward-facing groove and a downward-facing flat surface. With this configuration, the effect of gravity removes clearances around bearing balls in a precision X-Y table. However, in a linear motor used in a high-speed probing application, the use of a constant force mechanism, such as gravity or a spring, to hold the linear bearings together, is not believed to be practical because of the high shock loadings experienced during contact of the probe with the circuit being tested.

Thus, what is needed is a linear motor having a method for minimizing or eliminating the clearance around bearing balls in a linear bearing, which also has a configuration placing the magnetic structure and electrically driven coils generally in alignment with the tracks of the linear bearing, extending within and/or around the linear bearing.

SUMMARY OF THE INVENTION

According to a first aspect of the present invention, there is provided a linear actuator including an electromagnetic structure, two pairs of linear bearing tracks, an armature, and a stator. The electromagnetic structure includes a coil through which current is directed, a permanent magnet, and a yoke arranged to direct magnetic flux from said permanent magnet across a portion of the coil. The two pairs of linear bearing tracks are spaced apart in a first direction, with the electromagnetic structure extending between the two pairs of linear bearing tracks. Each of the pairs of linear bearing tracks includes a stationary bearing track, a moving bearing track, and a number of rolling elements rolling between the stationary bearing track and the moving bearing track. Furthermore, each of the pairs of linear bearing tracks includes a bearing track which is movable in a direction adjusting its engagement with the plurality of rolling elements. The armature connects the coil with the moving bearing track in each of the pairs of linear bearing tracks, so that the coil moves with the moving bearing tracks in a second direction perpendicular to the first direction. The stator connects the yoke of each of the stationary bearing tracks.

The placement of the electromagnetic structure between the two pairs of linear bearing tracks minimizes the generation of torques operating between the coil and the bearing tracks when electrical current is applied to the coil to move the armature. Such torques would otherwise increase bearing loading and cause an unnecessary deflections of parts.

The provision for adjusting one of the bearing tracks in each of the pairs of bearing tracks allows a pre-load force to be set between the bearing tracks and the rolling elements, so that clearance between the bearing tracks and the rolling elements is eliminated or minimized. The bearing tracks which are adjusted in this manner are preferably outwardly exposed so that a pre-load force can easily be applied.

In accordance with another aspect of the present invention, there is provided a tool for adjusting a position of a linear bearing track in a linear actuator. The tool includes an engagement portion engaging a surface of the linear actuator; and a flexible portion engaging the linear bearing track with a pre-determined force.

BRIEF DESCRIPTION OF THE DRAWINGS

FIG. 5 is a front elevation of a moving bearing track within the linear actuator of FIG. 1;

FIG. 6 is a rear perspective view of the linear actuator of FIG. 1, showing particularly a position transducer used to provide an electrical signal indicating the position of the armature within the linear actuator of FIG. 1;

FIG. 7 is a rear elevation of a mask forming part of a moving portion of the position transducer of FIG. 6.

DETAILED DESCRIPTION

Figure 1:
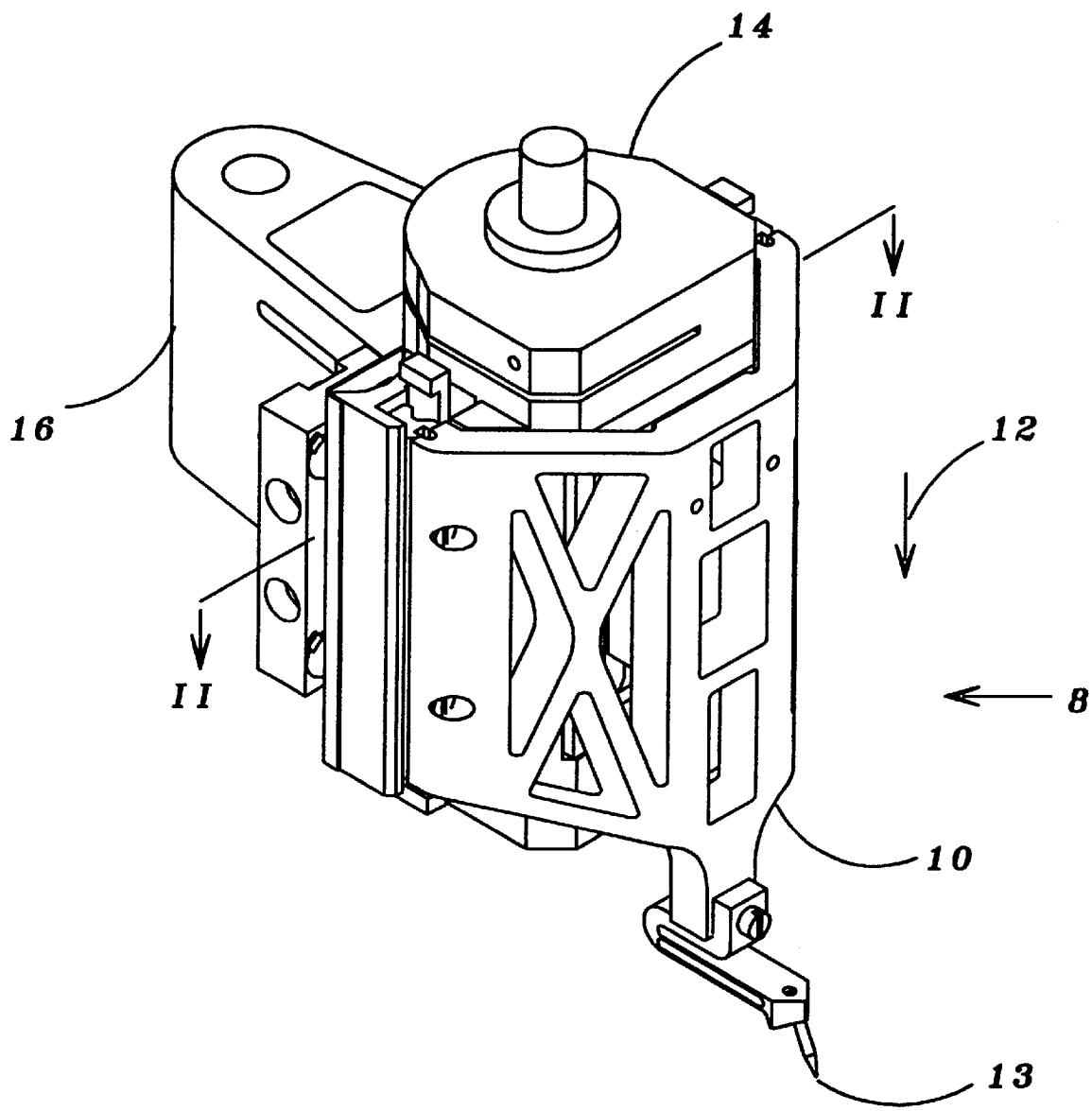
FIG. 1 is a front perspective view of a linear actuator built in accordance with the present invention.

FIG. 1 is a front perspective view of a linear actuator 8 built in accordance with the present invention. The actuator includes an armature 10 which moves in the Z-direction indicated by arrow 12 to engage a probe 13 with a feature on a circuit being tested (not shown). The armature 10 moves in and opposite this direction of arrow 12 through a total stroke of 3 mm. The linear actuator 8 also includes a stator 14 and a linear bearing assembly 16 providing for linear movement of the armature 10 on the stator 14.

Figure 2:
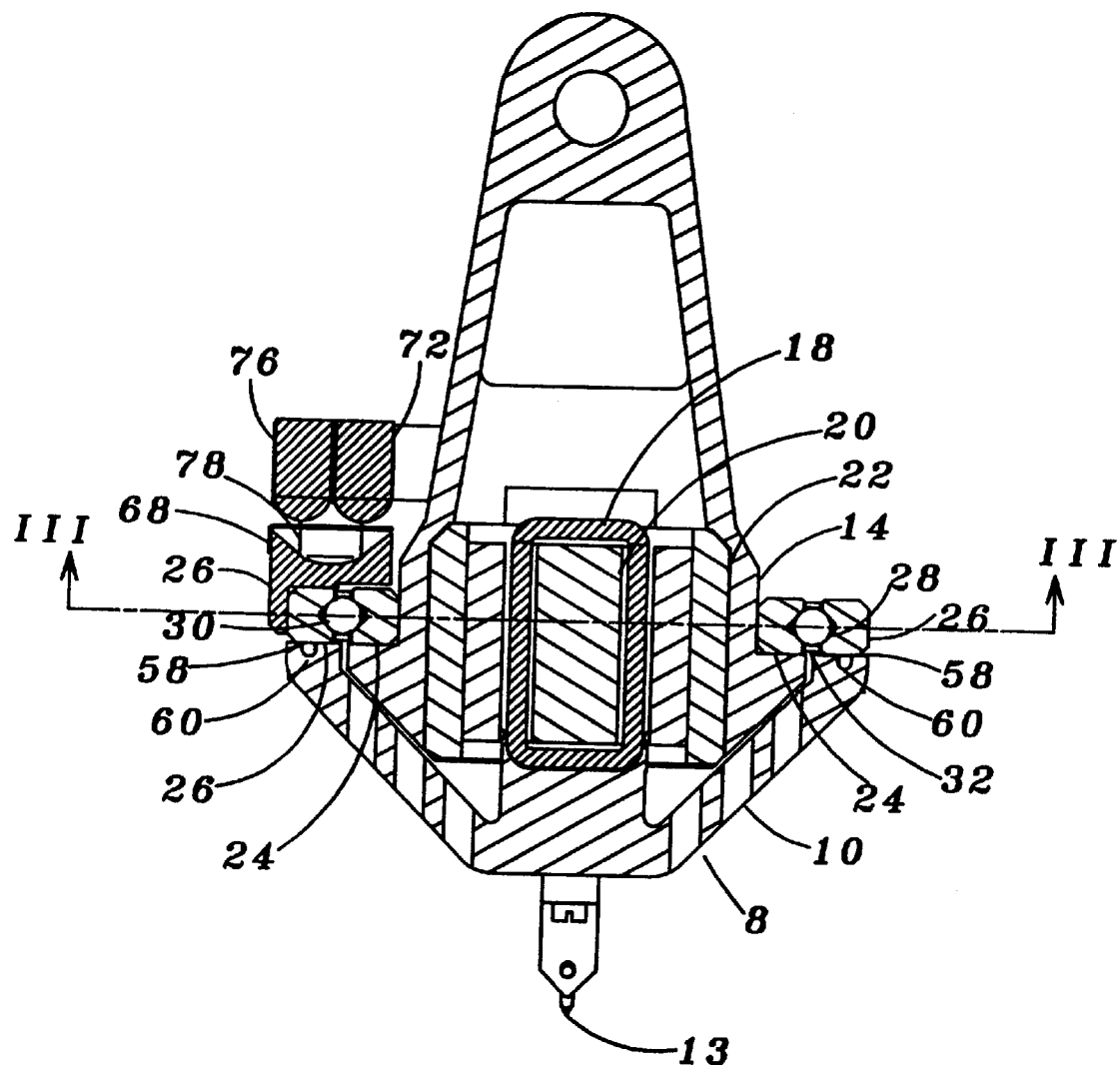
FIG. 2 is a cross-sectional plan view of the linear actuator of FIG. 1, taken as indicated by section lines II—II in FIG. 1.

FIG. 2 is a cross-sectional plan view of the linear actuator 8, taken as indicated by section lines II—II in FIG. 1. A coil bobbin 18 is attached to move with the armature 10, extending around a central post 20 of a yoke, generally indicated as 22, which forms a portion of the stator 14. The bearing assembly 16 includes a pair of stationary bearing tracks 24, 25 attached to the stator 14, and a pair of moving bearing tracks 26, 27 attached to the armature 10. Each of the bearing tracks 24, 25, 26, 27 includes a groove 28 in which a number of bearing balls 30 roll, being individually retained in holes within a plate-shaped retaining cage 32. Good results have been achieved using a plate-shaped retaining cage 32 composed of a graphite-filled polyimide, such as that sold under the trade name VESPEL SP-21 by DuPont Polymers, Newark, Del.

Figure 3:
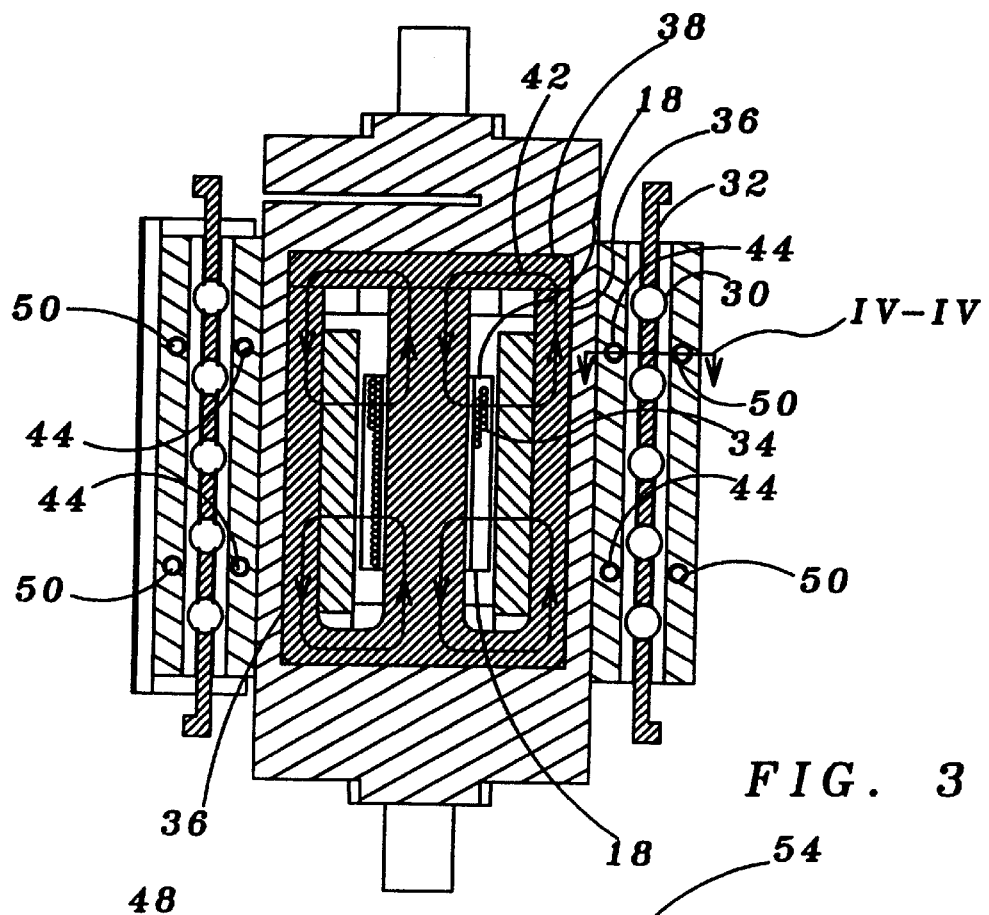
FIG. 3 is a cross-sectional elevation of the linear actuator of FIG. 1, take as indicated by section lines III—III in FIG. 1.

FIG. 3 is a cross-sectional elevation of the linear actuator 8, taken as indicated by section lines III—III in FIG. 2. A coil 34 is wound around the bobbin 18. The yoke 22 includes the central post 20, a pair of lateral posts 36, and an upper plate 38. A pair of permanent magnets 40 are held within the yoke 22. These magnets 40 are magnetized across their widths, so that magnetic flux flows through the yoke 22 and across the coil 34 as indicated by flux lines 42. Thus when an electrical current flows within the coil 34, the coil 34, and hence the armature 10, is caused to move in the engagement direction of arrow 12, or opposite thereto, depending on the direction of current flow.

Figure 4:
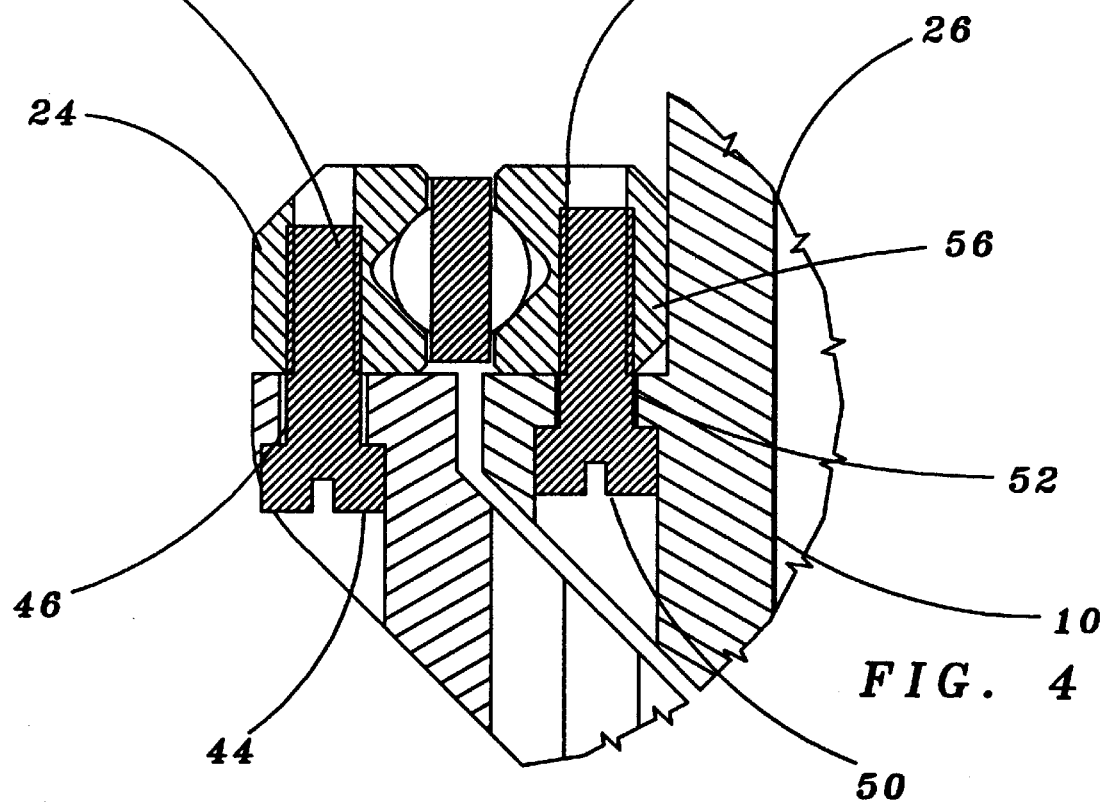
FIG. 4 is a fragmentary cross-sectional plan view of the linear actuator 8, taken as indicated by section lines IV—IV in FIG. 3 to show the means used to attach bearing tracks within the linear actuator of FIG. 1.

FIG. 4 is a fragmentary cross-sectional plan view of the linear actuator 8, taken as indicated by section lines IV—IV in FIG. 3 to show the means used to attach the stationary bearing tracks 24, 25 and moving bearing tracks 26, 27 to the stator 14 and the armature 10, respectively. Each stationary bearing track 24, 25 is attached to the stator 14 by means of a pair of screws 44 extending though a clearance hole 46 within the stator 14 to engage a threaded hole 48 within the stationary bearing track 24, 25. Each moving bearing track 26, 27 is attached to the stator 14 by means of a screw 50 extending through a clearance hole 52 within the armature 10 to engage a threaded hole 54 within the moving bearing track 26. The clearance holes 52 are large enough to allow the moving bearing tracks 26, 27 to be moved inwardly and outwardly on the mounting surfaces 56 of the armature 10, with the screws 50 loosened, so that the engagement of the moving bearing tracks 26, 27 with the stationary bearing tracks 24, 25 can be adjusted to minimize the clearance between the bearing tracks 26, 24 and the bearing balls 30 without causing mechanical interferences, which would increase forces opposing motion of the armature 10, and which would increase wear within the bearing tracks 26, 24.

FIG. 5 is a front elevation of a moving bearing track 26, showing the threaded holes 54 used for attachment and a pair of grooves 58 which are clamped into position facing corresponding grooves 60 in the armature 10 (shown in FIG. 2). After the clearances at the ball bearings 30 are set, the grooves 58, 60 facing one another are filled with a potting compound which, when hardened, aids the screws 52 in preventing relative movement between the moving bearing tracks 26 and the armature 10.

FIG. 6 is a rear perspective view of the linear actuator 8, showing particularly a position transducer 62 used to provide an electrical signal indicating the position of the armature 10 as it is moved in and opposite the engagement direction indicated by arrow 12. The position transducer 62 includes a stationary portion 64, attached to the stator 14, and a moving portion 66, attached to a moving bearing track 26 to move with the armature 10.

FIG. 7 is a rear elevation of a mask 68 forming part of the moving portion 62.

Referring to FIGS. 2, 6, and 7, the stationary portion 64 of position transducer 62 includes a pair of LED light sources 70, 72 and a pair of photo-detectors 74, 76. The moving portion 66 of the position transducer 62 includes the mask 68 and a reflector 78. The mask 68 includes a pair of rectangular apertures 80, 82 and a pair of triangular apertures 84, 86. As indicated by line 88 in FIG. 2, the light from each light source 70, 72 is transmitted through the corresponding rectangular aperture 80, 82, reflected twice from the reflector 78, transmitted through the corresponding triangular aperture 84, 86, and received by the corresponding photodetector 74, 76. Thus, movement of the armature 10 in the engagement direction indicated by arrow 12 causes the light entering the lower photodetector 74 to decrease with decreasing width of the lower triangular aperture 84, while the light entering the upper photodetector 76 increases with increasing width of the upper triangular aperture 86. Similarly, movement of the armature 10 opposite the engagement direction indicated by arrow 12 causes the light entering the upper photodetector 74 to increase with increasing width of the lower triangular aperture 84, while the light entering the upper photodetector 76 decreases with decreasing width of the upper triangular aperture 86. The output signals from the lower photodetector 74 and the upper photodetector 76 are provided, for example, as the two inputs to a differential amplifier (not shown), so that an output signal proportional to the difference between the outputs of the photodetectors 74,76 is produced. This output signal provides an indication of the position of the armature 10 as it is moved in and opposite to the engagement direction of arrow 12.

The position detector of the present invention has an advantage over the position detector described in U.S. Pat. No. 5,153,472 in that a requirement to divide the output beam of a single light source is eliminated. Such a division may be difficult to perform consistently and accurately.

Figure 8:
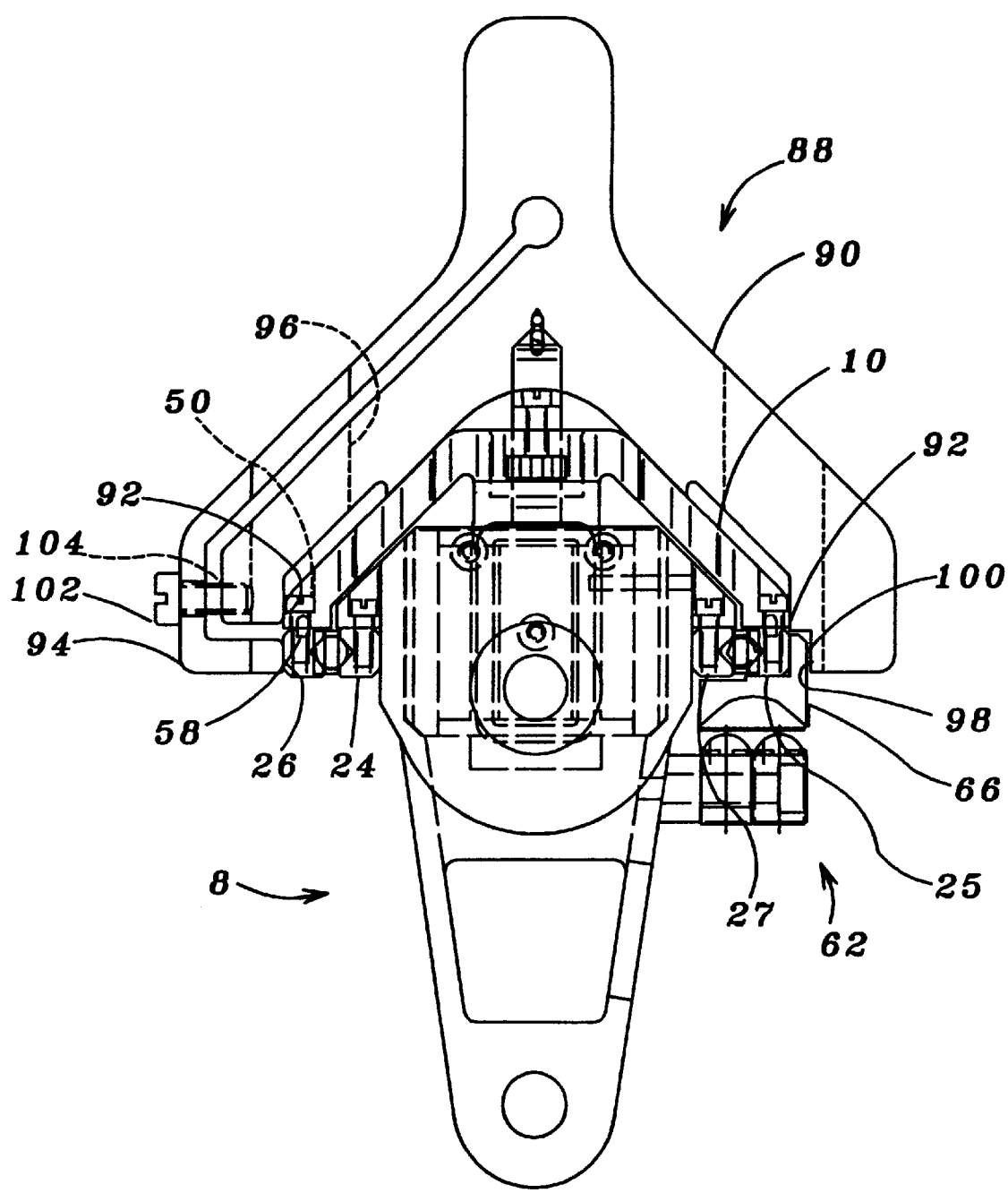
FIG. 8 is a plan view of linear bearing adjustment tool engaging the linear actuator of FIG. 1 to aid in the adjustment of the position of a moving bearing tracks during the process of building the linear actuator of FIG. 1.

FIG. 8 is a plan view of linear bearing adjustment tool 88 engaging the linear actuator 8 to aid in the establishment of a pre-load force within a first linear bearing including bearing tracks 24, 26 and a second linear bearing including the bearing tracks 25, 27. The adjustment tool 88 includes a rigid portion 90 with contact surfaces 92 engaging the armature 10 and a cantilever 94 engaging the moving bearing track 26. This adjustment procedure is performed with the screws 50 holding the bearing track 26, to which force is applied by the cantilever 94 initially loosened, but with the screws 50 holding the stationary bearing track 24 tightened. The force developed within the cantilever 94 is applied as a pre-load force exerted between the moving bearing track 26 and the bearing balls 30 (shown in FIG. 2) between the moving bearing track 26 and the stationary bearing track 24. This force is applied as a reaction force through the balls 30 to the stationary bearing track 24, and thereby to the stator 14, to which the stationary bearing track 24 is rigidly attached. This force is thereby applied to the other stationary bearing track 25. A reaction force is thus applied through another set of balls 30 (also shown in FIG. 2) between the other stationary bearing track 25 and the other moving bearing track 27, both of which are rigidly attached to the stator 14 and the armature 10, respectively. In this way, a pre-load force is simultaneously applied both in the linear bearing including tracks 24, 26 and in the linear bearing including tracks 25, 27.

When the screws 50 are tightened and the adjustment tool 88 is removed, this pre-load force remains to eliminate clearance between the bearing tracks 24, 26 and the bearing balls 30, in one linear bearing, and to eliminate clearance between the bearing tracks 27, 27 and the other bearing balls 30, while preventing the application of high bearing loads, which could cause wear and resistance to movement of the armature 10. The adjustment tool 88 includes clearance holes 96 providing clearance for tightening the screws 50 and a slot 98 providing clearance for the moving portion 66 of position transducer 62.

The preceding discussion has assumed that the pre-load force is developed by the deflection of the flexible member 94, with this deflection occurring as the linear actuator 8 is inserted within the adjustment tool 88. Alternatively, a clamping screw 102, inserted into a threaded hole 104 within the tool 88 to engage and load the flexible member 94, may be used to determine the pre-load force. When the clamping screw 102 is used in this way, the weight of the adjustment tool 88 is preferably such that, when the adjustment tool 88 and armature 10 move together, under their own weight, the pre-load is not too great. Therefore, the pre-load force can be determined by adjusting the screw 102 to prevent such motion, and by then backing the screw 102 out until such motion can occur.

Thus, the process of making the linear actuator 10 includes installing the adjustment tool 88 as shown, with contact surfaces 92 engaging the armature 10 and with the flexible member 94 engaging the moving bearing track 26 to apply a pre-load force. The screws 50 are tightened during the continued application of the pre-load force, so that the level of force between the bearing track 26 and the balls 30 (shown in FIG. 2) is maintained after the tool is removed. A slot formed by grooves 58 in the bearing track 26 and by adjacent grooves 60 in the armature 10 is filled with a potting compound, such as a compound sold under the trade name TRA-BOND BC-2151 by Tracon, Inc. of Bedford, Mass. This compound dries within this slot to aid the screws 50 in maintaining alignment between the bearing track 26 and the armature 10. This compound is also applied to fill similar slots formed by grooves 58 in the bearing track 27 and adjacent grooves 60 in the armature 10. This compound may be applied before or after the screws 50 are tightened. If the potting compound is applied after the screws 50 are tightened, it may be applied before or after the tool is removed.

The preceding discussion has assumed that the linear actuator is configured in the exemplary manner shown in the drawings, with the moving bearing tracks outwardly exposed for the application of a pre-load force. Alternately, but within the scope of the present invention, the stationary bearing tracks may be outwardly exposed for the application of the pre-load force, or the pre-load force may be applied in outward directions to inwardly-exposed bearing tracks, which may be stationary or moving.

While the invention has been described in its preferred form or embodiment with some degree of particularity, it is understood that this description has been given only by way of example, and that numerous changes in the details of construction, fabrication and use, including the combination and arrangement of parts or process steps, may be made without departing from the spirit and scope of the invention.

What is claimed is:

1. A linear actuator comprising:
    an electromagnetic structure including a coil through which current is directed, a permanent magnet, and a yoke arranged to direct magnetic flux from said permanent magnet across a portion of said coil;
    two pairs of linear bearing tracks, wherein said two pairs of linear bearing tracks are spaced apart in a first direction, wherein said electromagnetic structure extends between said two pairs of linear bearing tracks, wherein each of said pairs of linear bearing tracks includes a stationary bearing track, a moving bearing track, and a plurality of rolling elements rolling between said stationary bearing track and said moving bearing track, and wherein a bearing track within each of said pairs of linear bearing tracks is an adjustable bearing track, being movable in a direction adjusting engagement with said plurality of rolling elements;
    an armature connecting said coil with said moving bearing track in each of said pairs of linear bearing tracks to move with each said moving bearing track in a second direction perpendicular to first direction; and
    a stator connecting said yoke to each of said stationary bearing tracks.

2. The linear actuator of claim 1, additionally comprising:
    a mounting surface having a first groove, to which each said adjustable bearing track is attached;
    a second groove within each said adjustable bearing track; and
    a hardened compound extending within said first and second grooves.

3. The linear actuator of claim 2, additionally comprising a pair of screws attaching each said adjustable bearing track to each said mounting surface, wherein each said pair of screws is oriented so that, with said pair of screws loosened, said adjustable bearing track is movable in said direction adjusting engagement with said plurality of rolling elements.

4. The linear actuator of claim 1, wherein each said adjustable bearing track is outwardly exposed for application of a pre-load force.

5. The linear actuator of claim 4, wherein, within each said pair of bearing tracks,
    said adjustable bearing track is said moving bearing track, and
    said stationary bearing track lies between said moving bearing track and said electromagnetic structure.

6. The linear actuator of claim 5, wherein, within each said pair of bearing tracks, said adjustable bearing track is said moving bearing track.

7. The linear actuator of claim 1, additionally comprising a position sensor including:
    a stationary portion, attached to said stator, including a first light source, oriented to emit light in a third direction, perpendicular to said first and second directions, a first photodetector, displaced from said first light source in said first direction and oriented to receive light from said third direction, a second light source, displaced from said first light source in said second direction and oriented to emit light in said third direction, a second photodetector, displaced from said second light source in said first direction and oriented to receive light from said third direction; and
    a moving portion, moving with said aperture, including a curved reflector extending in said second direction and a mask having a first rectangular aperture adjacent said first light source, a second rectangular aperture adjacent said second light source, a first triangular aperture adjacent said first photodetector, and a second triangular aperture adjacent said second photodetector, wherein said curved reflector reflects light passing through said first rectangular aperture in said third direction to pass through said first triangular aperture in a direction opposite said third direction, and wherein said curved reflector reflects light passing through said second rectangular aperture in said third direction to pass through said second triangular aperture in said direction opposite said third direction.

8. The linear actuator of claim 7, wherein said first and second triangular apertures are tapered in opposite directions along said second direction.

9. The linear actuator of claim 1, wherein
    each said pair of linear bearing tracks additionally includes a plate-shaped retaining cage composed of graphite-filled polyimide, and
    said retaining cage includes a plurality of spaced-apart holes, with a rolling element turning in each of said spaced-apart holes.

* * * * *